(12) United States Patent
Shubham et al.

(10) Patent No.: US 11,323,823 B1
(45) Date of Patent: May 3, 2022

(54) MEMS DEVICE WITH A DIAPHRAGM HAVING A SLOTTED LAYER

(71) Applicant: Knowles Electronics, LLC, Itasca, IL (US)

(72) Inventors: Shubham Shubham, Itasca, IL (US); Hungchien Lin, Itasca, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 5 days.

(21) Appl. No.: 17/151,437

(22) Filed: Jan. 18, 2021

(51) Int. Cl.
*H04R 19/00* (2006.01)
*H04R 19/04* (2006.01)
*B81B 3/00* (2006.01)
*B81C 1/00* (2006.01)
*H04R 7/06* (2006.01)

(52) U.S. Cl.
CPC ........... *H04R 19/04* (2013.01); *B81B 3/0072* (2013.01); *B81C 1/00666* (2013.01); *H04R 7/06* (2013.01); *B81B 2201/0257* (2013.01); *B81B 2203/019* (2013.01); *B81B 2203/0127* (2013.01); *B81B 2207/012* (2013.01); *H04R 2201/003* (2013.01)

(58) Field of Classification Search
CPC .... H04R 19/04; H04R 7/06; H04R 2201/003; B81B 3/0072; B81B 2201/0257; B81B 2203/0127; B81B 2203/019; B81B 2207/012; B81C 1/00666
See application file for complete search history.

(56) References Cited

U.S. PATENT DOCUMENTS

| | | | |
|---|---|---|---|
| 9,462,389 B2 * | 10/2016 | Wang | H04R 7/16 |
| 2006/0077519 A1 * | 4/2006 | Floyd | G02B 7/008 |
| | | | 359/290 |
| 2008/0083961 A1 * | 4/2008 | Suzuki | H04R 19/005 |
| | | | 381/361 |
| 2008/0219482 A1 * | 9/2008 | Sato | H04R 19/04 |
| | | | 381/174 |
| 2009/0290741 A1 | 11/2009 | Daley et al. | |
| 2009/0316946 A1 * | 12/2009 | Wang | H04R 19/005 |
| | | | 381/369 |
| 2011/0317863 A1 * | 12/2011 | Inoda | H04R 19/04 |
| | | | 381/369 |
| 2020/0112800 A1 * | 4/2020 | Lee | H04R 19/04 |
| 2021/0078856 A1 * | 3/2021 | Zou | B81B 3/0018 |

OTHER PUBLICATIONS

Min-Xin Zhou, Qing-An Huang, Ming Qin and Wei Zhou, "A novel capacitive pressure sensor based on sandwich structures," in Journal of Microelectromechanical Systems, vol. 14, No. 6, pp. 1272-1282, Dec. 2005, doi: 10.1109/JMEMS.2005.859100.
Yoo, Ilseon & Sim, Jaesam & Yang, Sanghyeok & Kim, Hyunsoo. (2018). Development of capacitive MEMS microphone based on slit-edge for high signal-to-noise ratio. 1072-1075. MEMS 2018, Belfast, Northern Ireland, UK, Jan. 21-25, 2018; 10.1109/MEMSYS. 2018.8346745.

* cited by examiner

*Primary Examiner* — Matthew A Eason
(74) *Attorney, Agent, or Firm* — Flener IP & Business Law; Zareefa B. Flener; Ayhan E. Mertogul

(57) ABSTRACT

An MEMS acoustic transducer includes a substrate having an opening formed therein, a diaphragm comprising a slotted insulative layer, and a first conductive layer. The slotted insulative layer is attached around a periphery thereof to the substrate and over the opening, and the first conductive layer is disposed on a first surface of the slotted insulative layer. A backplate is separated from the diaphragm and disposed on a side of the diaphragm opposite the substrate.

20 Claims, 11 Drawing Sheets

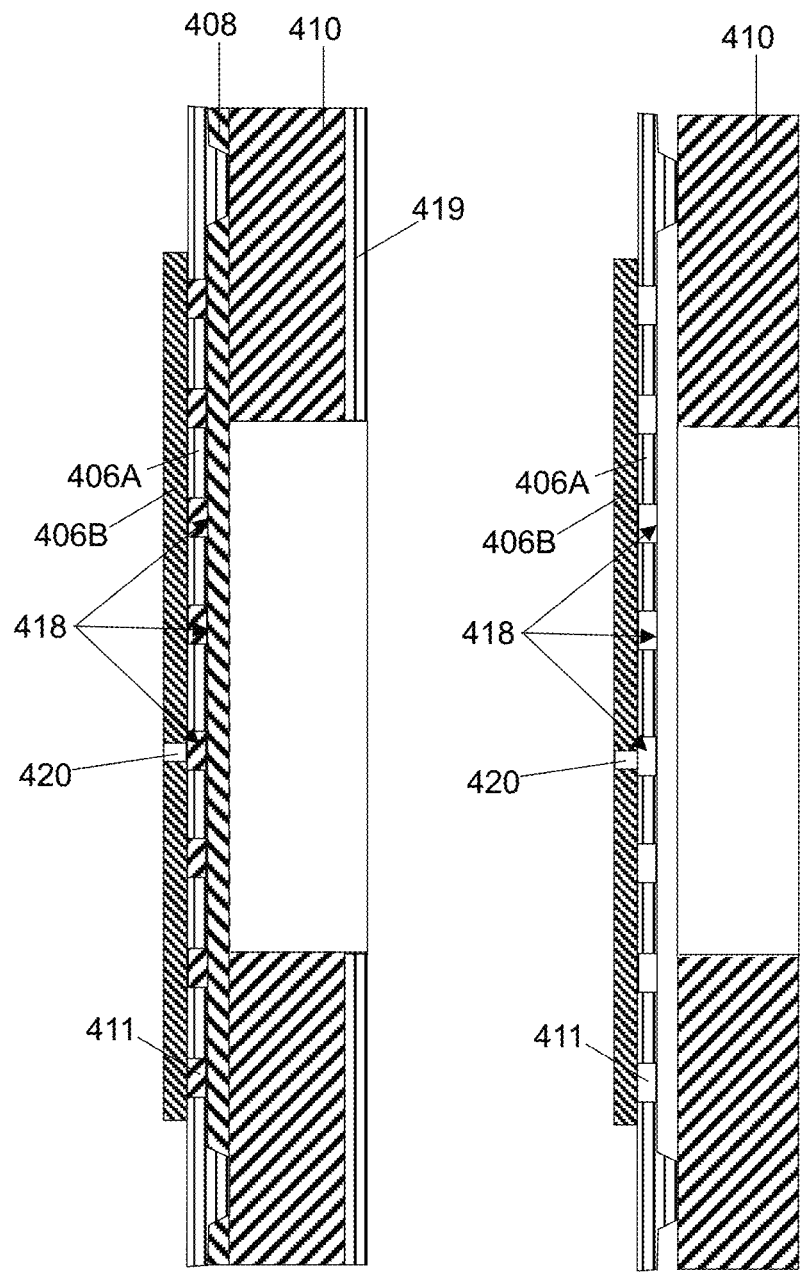

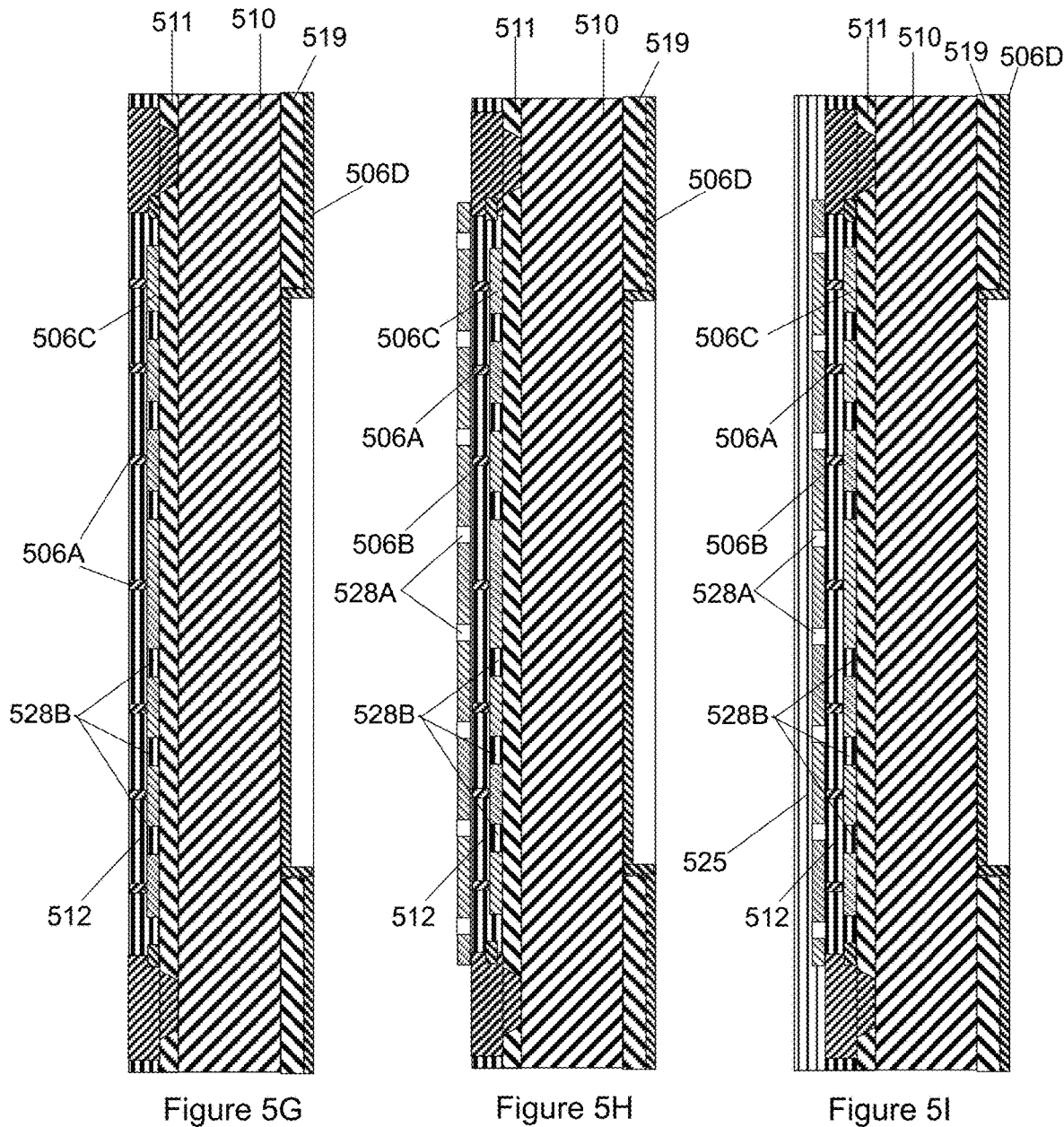

US 11,323,823 B1

MEMS DEVICE WITH A DIAPHRAGM HAVING A SLOTTED LAYER

FIELD OF THE DISCLOSURE

The present disclosure relates generally to a microelectromechanical systems (MEMS) device having a diaphragm, and more particularly to MEMS acoustic transducer having a diaphragm including a slotted layer.

BACKGROUND

It has generally been accepted that a multi-layered diaphragm for a MEMS acoustic transducer can suffer from performance degradation resulting from a CTE mismatch between the layers. Slots disposed through one of the layers as presented herein decouples the two layers while also minimizing the stress in the slotted layer.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

FIG. 4G depicts a stage in the fabrication process for a portion of the MEMS acoustic transducer of FIG. 1A subsequent to the stage shown in FIG. 4F.

FIG. 4H depicts a stage in the fabrication process for a portion of the MEMS acoustic transducer of FIG. 1A subsequent to the stage shown in FIG. 4G.

FIG. 5G depicts a stage in the fabrication process for a portion of the MEMS acoustic transducer of FIG. 2A subsequent to the stage shown in FIG. 5F.

FIG. 5H depicts a stage in the fabrication process for a portion of the MEMS acoustic transducer of FIG. 2A subsequent to the stage shown in FIG. 5G.

FIG. 5I depicts a stage in the fabrication process for a portion of the MEMS acoustic transducer of FIG. 2A subsequent to the stage shown in FIG. 5H.

Figure 1A:
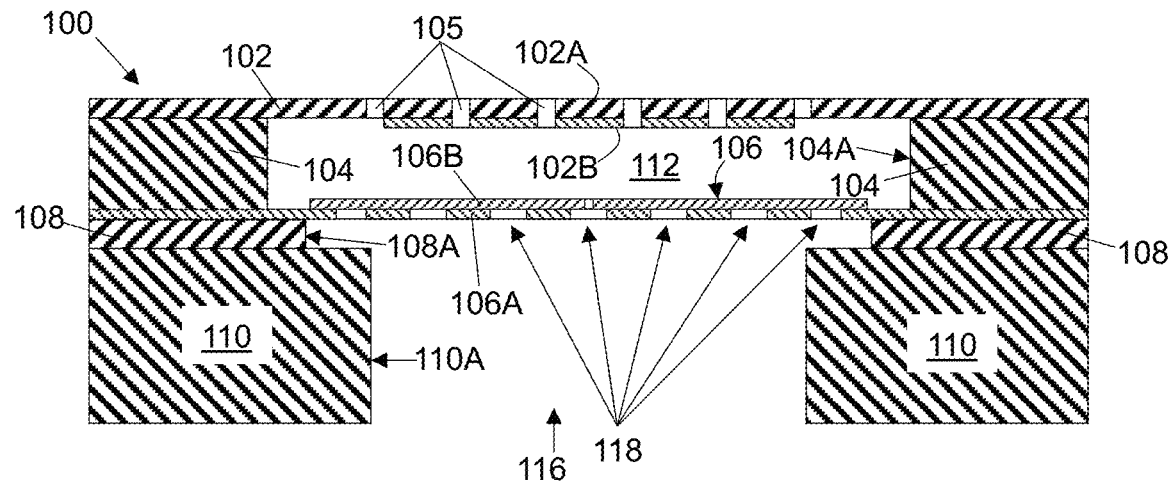
FIG. 1A is a cross-sectional schematic view of a MEMS acoustic transducer according to a first embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

The insulative and conductive layers of a MEMS diaphragm are made of different materials that have different coefficients of thermal expansion (CTE), which can create undesirable stress between the layers over a range of temperatures. Such stress can degrade the performance of the diaphragm. For example, when used as part of a microphone a diaphragm having additional internal stresses can have reduced compliance/acoustic sensitivity and/or a varying compliance/acoustic sensitivity with temperature. This is a known MEMS industry problem which has been addressed to some extent using particular diaphragm materials or multilayer diaphragms. However, performance reduction due to a CTE mismatch is inherent in all constrained multi-layer diaphragms including those having corrugation features in one of the layers.

There are couple of ways in which the undesirable stress caused by a CTE mismatch can be addressed. One way is to select materials for the two layers having close CTE values to minimize the effect of the CTE mismatch and resultant temperature induced stresses. Another way is to alter the internal structure of one of the layers, for example, to reduce the Elastic Modulus of the layer, which reduces the inherent stiffness significantly. Slots disposed through the insulative layer can isolate or decouple the two layers. Further, the slots open up upon stress relaxation of the insulative layer, so that the stress in the center of the insulative layer is reduced, thereby providing for high acoustic compliance. The slotted insulative layer therefore provides both decoupling between the layers and stress reduction, both of which effects cannot be achieved with a layer having corrugated features but no slots.

In general, disclosed herein are a MEMS device having a diaphragm that includes a slotted layer of material and a microphone incorporating such a MEMS device. The details of both will be more fully explained by reference to the figures.

According to an embodiment, a MEMS acoustic transducer includes a substrate having an opening formed therein; a diaphragm comprising a slotted insulative layer, and a first conductive layer, the slotted insulative layer attached around a periphery thereof to the substrate and over the opening, the first conductive layer disposed on a first surface of the slotted insulative layer; and a backplate separated from the diaphragm and disposed on a side of the diaphragm opposite the substrate.

In an embodiment, a MEMS acoustic transducer includes a substrate having an opening formed therein; a diaphragm comprising a slotted insulative layer, and first and second conductive layers, the slotted insulative layer attached around a periphery thereof to the substrate and over the opening; the first conductive layer disposed on a first surface of the slotted insulative layer and having a plurality of first holes disposed therethrough, and the second conductive layer disposed on a second surface of the slotted insulative layer and having a plurality of second holes disposed therethrough; and at least one backplate separated from the diaphragm and attached around a periphery thereof to the substrate.

According to an embodiment, a microphone device includes a MEMS acoustic transducer comprising a substrate having an opening formed therein; a diaphragm comprising a slotted insulative layer, and a first conductive layer, the slotted insulative layer attached around a periphery thereof to the substrate and over the opening, the first conductive layer disposed on a first surface of the slotted insulative layer; and at least one backplate separated from the diaphragm and attached around a periphery thereof to the substrate.

In an embodiment, the microphone device further includes a base having a first surface, an opposing second surface, and a port, wherein the port extends between the first surface and the second surface; and an integrated circuit (IC) disposed on the first surface of the base; wherein the MEMS acoustic transducer is disposed on the first surface of the base; and a cover is disposed over the first surface of the base covering the MEMS acoustic transducer and the IC.

According to an embodiment, the substrate comprises Silicon, the slotted insulative layer comprises a layer of Silicon Nitride having a thickness in a range of about 0.5 μm to about 1.5 μm, and the first conductive layer comprises a layer of Polycrystalline Silicon having a thickness in a range of about 150 nm to about 300 nm.

Turning to FIG. 1A, a MEMS acoustic transducer according to an embodiment is shown. The MEMS acoustic transducer, generally labelled 100, includes a backplate 102, a first spacer 104, a diaphragm 106, a second spacer 108, and a substrate 110. The diaphragm 106 and the backplate 102 can be any shape. The first spacer 104, the second spacer 108, and the substrate 110 may all be part of a single unitary body. The diaphragm 106, in an embodiment, is made of an insulative layer 106A and a conductive layer 106B. In an embodiment, the insulative layer 106A is made from Silicon Nitride, the conductive layer 106B is made from polycrystalline Silicon, and the substrate 110 is made from Silicon. Additional structure of and a process for fabrication of the diaphragm 106 used in the MEMS acoustic transducer 100 are further described hereinbelow.

In an embodiment, the backplate 102 has a first surface 102A, which is part of an insulative or dielectric layer, and a second surface 102B, which is part of a conductive layer (a first electrode), opposite the first surface 102A. The diaphragm 106 is supported between and constrained by the first spacer 104 (which is in contact with the insulative layer 106A) and the second spacer 108 (which is also in contact with the insulative layer 106A). The first spacer 104 has a curved interior wall 104A. The second surface 102B of the backplate 102, an internal surface of the of the diaphragm 106, and the interior wall 104A of the first spacer 104 define a chamber 112. In an embodiment the backplate 102 includes one or more holes 105 disposed therethrough.

The second spacer 108 has a curved interior wall 108A. The diaphragm 106 is fully constrained (by the first spacer 104 and the second spacer 108) along a boundary that is defined by a curve along which the interior wall 104A of the first spacer 104 meets the diaphragm 106. The substrate 110 also has a curved interior wall 110A, which defines an opening 116 that extends through the substrate 110. In an embodiment, the first and second spacers 104 and 108 are part of the sacrificial material of the MEMS acoustic transducer 100, and the walls 104A and 108A of the spacers are made from a time-limited etch front of the sacrificial material.

Figure 2A:
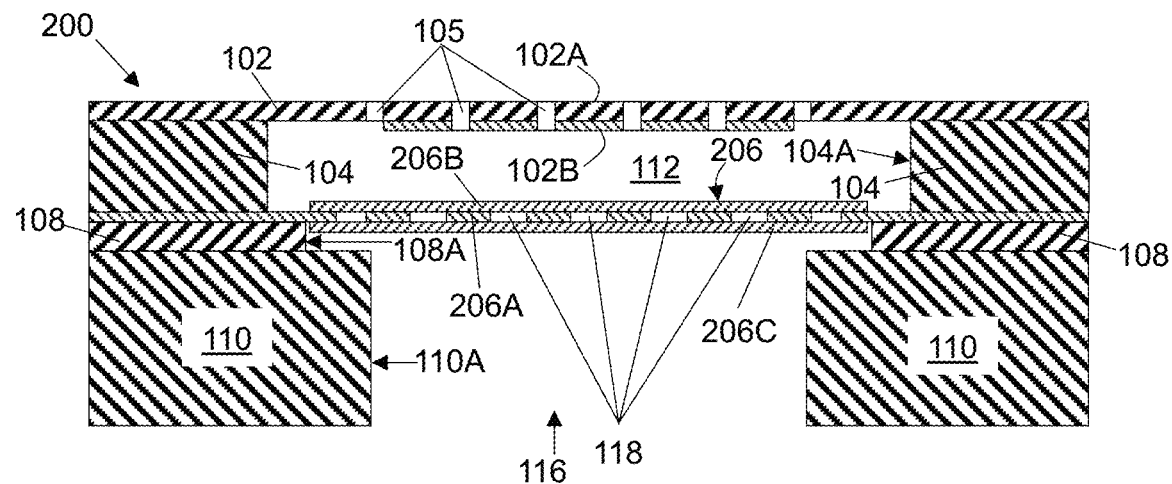
FIG. 2A is a cross-sectional schematic view of a MEMS acoustic transducer according to a second embodiment.
Figure 2B:
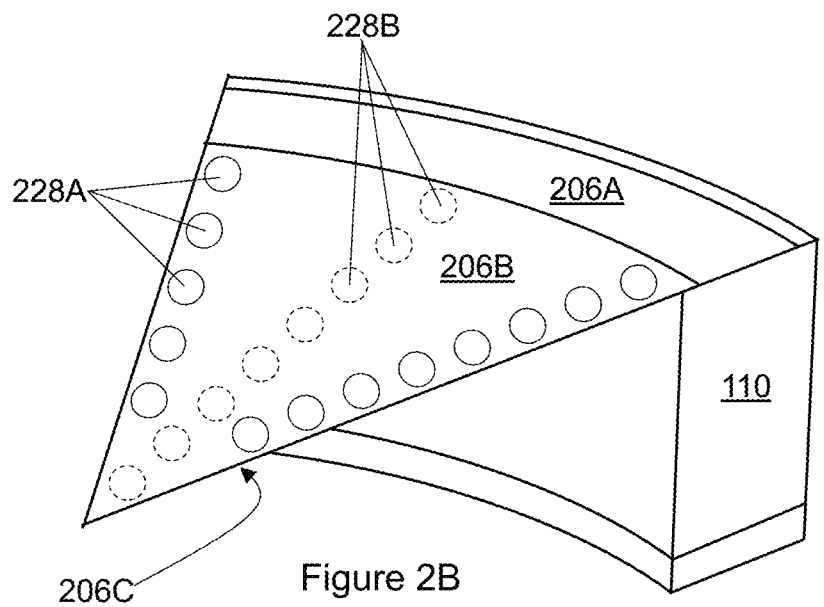
FIG. 2B is perspective cross-sectional schematic view of a portion of the diaphragm of the MEMS acoustic transducer of FIG. 2A.
Figure 2C:
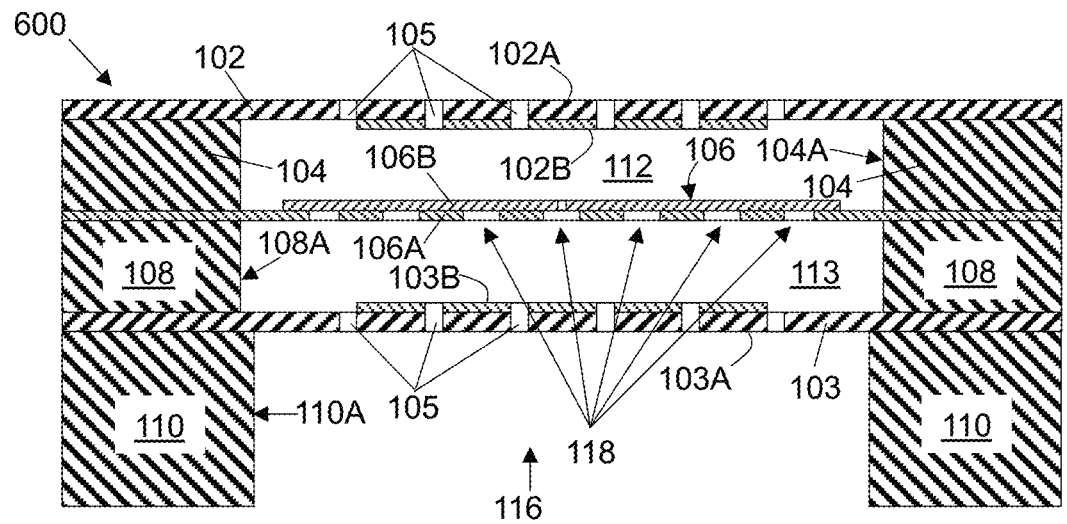
FIG. 2C is a cross-sectional schematic view of a MEMS acoustic transducer according to a third embodiment.

Referring now to FIG. 2C, a MEMS acoustic transducer 600 according to another embodiment is shown. The MEMS acoustic transducer 600 shares many of the elements already described in regard to the MEMS acoustic transducer 100 described in regard to FIG. 1A. Accordingly many of the same reference numerals are presented in FIG. 2C to describe like elements as described in FIG. 1A. However, the MEMS acoustic transducer 600 includes additional structure not present in the MEMS acoustic transducer 100. For example, the MEMS acoustic transducer 600 includes a second backplate 103 wherein the diaphragm 106 is disposed between the first and second backplates 102, 103.

There are many possible implementations of the backplate 102, the backplate 103, and the diaphragm 106. For example, the second backplate 103 may or may not be present. In another example, the first backplate 102 and/or the second backplate 103 may include an insulative or dielectric layer and a conductive layer that is deposited onto or otherwise connected to the dielectric layer. Similar to the backplate 102, in an embodiment the backplate 103 as illustrated in FIG. 2C has a first surface 103A, which is part of an insulative or dielectric layer, and a second surface 103B, which is part of a conductive layer (an electrode), opposite the first surface 103A. The second surface 103B of the backplate 103, an internal surface of the of the diaphragm 106, and the interior wall 108A of the second spacer 108 define a chamber 113. In an embodiment the backplate 103 includes one or more holes 105 disposed therethrough.

The diaphragm 106 may be made entirely from a conductive layer. In other implementations, the diaphragm 106 includes both an insulative layer 106A and a conductive layer 106B as shown in FIG. 1A, similar to the first and second backplates 102, 103. In yet other implementations, the diaphragm 106 includes both a conductive layer 106B and an insulative layer 106A, and one or both of the first and second backplates 102, 103 is formed entirely from a conductive layer. The conductive layers of the backplates 102, 103 and the diaphragm 106 may be facing one another without any materials therebetween or may be separated from one another by an insulative layer of the diaphragm 106 and/or backplates 102, 103. The insulative layers of the backplates 102, 103 and the diaphragm 106 may be made, for example without limitation, from Silicon Nitride or other suitable insulative material. The conductive layers on the backplates 102, 103 and/or the diaphragm 106 may be made, for example without limitation, from a polycrystalline Silicon, a metal, or other suitable conductor.

Referring to FIG. 1A, in an embodiment, the insulative layer 106A of the diaphragm 106 includes a plurality of slots 118 disposed therethrough. The slots 118 illustrated in FIG. 1A are presented in a schematic context not intended to be an accurate representation of the size, shape, arrangement, or orientation of the slots 118.

Figure 1B:
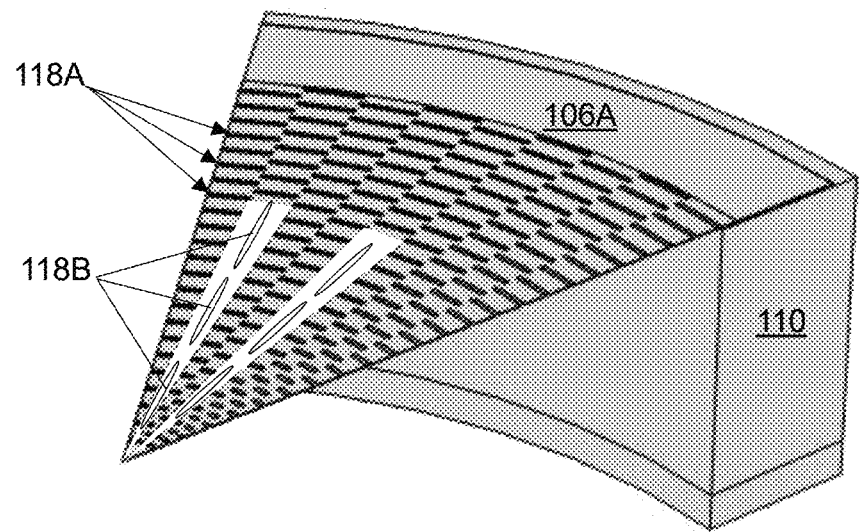
FIG. 1B is perspective cross-sectional schematic view of a portion of the diaphragm of the MEMS acoustic transducer of FIG. 1A.

Referring to FIG. 1B, a wedge-shaped portion of the diaphragm 106 is illustrated showing the insulative layer 106A without the conductive layer 106B. FIG. 1B shows exemplary arrangements of the slots 118 of FIG. 1A providing examples of their relative sizes, shapes, arrangements, and orientation. For example, in a first embodiment, each slot 118A is an elongate curvilinear slot having a long dimension and a short dimension and oriented having the long dimension aligned generally circumferentially around a center of the slotted insulative layer 106A. In another embodiment, each slot 118B is an elongate linear slot having the long dimension aligned generally radially relative to the center of the slotted insulative layer 106A. In a further embodiment, the slots 118 can be a combination of the curvilinear slots 118A and/or the linear slots 118, each as shown in FIG. 1B or each having any other size, shape, arrangement, or orientation.

Still referring to FIGS. 1A and 1, in an embodiment the short dimension for each of the slots 118, 118A, 118B is in a range of about 2 μm to about 8 μm. The long dimension of the curvilinear slots 118A is commonly referred to as the curvilinear length of arc. The long dimension for each of the slots 118, 118A, 118B can vary with the overall size of the diaphragm 106. In an embodiment, for example for a diaphragm 106 having a radius in a range of about 250 μm to about 700 μm, the long dimension for each of the slots 118, 118A, 118B is in a range of about 10 μm to about 500 μm. The long dimension for each of the slots 118, 118A, 118B can have a length within this range or be shorter or longer than this range for a diaphragm having a radius that is outside of the range of about 250 μm to about 700 μm.

Still referring to FIGS. 1A and 1B, in an embodiment a slotted insulative layer 106A comprises a layer of Silicon Nitride. In an embodiment, the slotted insulative layer 106A has a thickness in a range of about 0.5 μm to about 1.5 μm. In another embodiment, the conductive layer 106B comprises a layer of polycrystalline Silicon, and in a further embodiment the conductive layer 106B has a thickness in a range of about 150 nm to about 300 nm. In another embodiment, the layers 106A, 106B of the diaphragm 106 are made from other materials and/or have other thicknesses as may be desired or otherwise known in the art.

Referring now to FIG. 2A, a MEMS acoustic transducer 200 according to another embodiment is shown. The MEMS acoustic transducer 200 shares many of the elements already described in regard to the MEMS acoustic transducer 100 described in regard to FIG. 1A. Accordingly many of the same reference numerals are presented in FIG. 2A to describe like elements as described in FIG. 1A. However, the diaphragm 206 of the MEMS acoustic transducer 200 includes additional structure not present in the diaphragm 106. For example, the diaphragm 206 includes a slotted insulative layer 206A (like the slotted insulative layer 106A) as well as a first conductive layer 206B (like the conductive layer 106B). However, the diaphragm 206 further comprises a second conductive layer 206C disposed on a surface of the slotted insulative layer 206A opposite from the first conductive layer 206B.

In an embodiment, the second conductive layer 206C is made of a polycrystalline Silicon; however, in another embodiment the second conductive layer 206C can be made, for example without limitation, from a metal, or other suitable conductor as is known in the art. In an embodiment, each of the first and second conductive layers 206B, 206C has a thickness in a range of about 150 nm to about 300 nm. In another embodiment, each of the first and second conductive layers 206B, 206C of the diaphragm 206 are made from other materials and/or have other thicknesses as may be desired or otherwise known in the art.

Figure 2D:
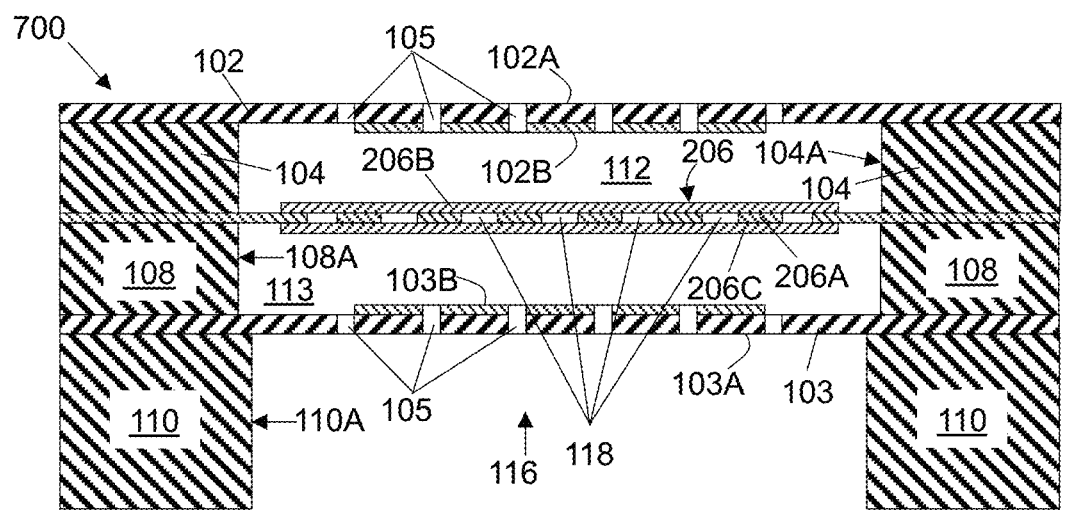
FIG. 2D is a cross-sectional schematic view of a MEMS acoustic transducer according to a fourth embodiment.

Referring to FIG. 2D, a MEMS acoustic transducer 700 according to another embodiment is shown. The MEMS acoustic transducer 700 shares many of the elements already described in regard to the MEMS acoustic transducer 200 described in regard to FIG. 2A. Accordingly many of the same reference numerals are presented in FIG. 2D to describe like elements as described in FIG. 2A. However, the MEMS acoustic transducer 700 includes additional structure not present in the MEMS acoustic transducer 200. For example, the MEMS acoustic transducer 700 includes a second backplate 103 wherein the diaphragm 206 is disposed between the first and second backplates 102, 103. The second backplate 103 has already been described hereinabove with regard to the MEMS acoustic transducer 600 illustrated in FIG. 2C.

Referring now to FIG. 2B, a wedge-shaped portion of the diaphragm 206 is illustrated, where the first conductive layer 206B is visible on a top of the diaphragm 206 and the second conductive layer 206C is not visible but is indicated with the curved arrow. In an embodiment, each of the first and second conductive layers 206B and 206C includes a plurality of holes disposed therethrough. FIG. 2B illustrates a first plurality of holes 228A (shown schematically as solid circles 228) disposed through the first conductive layer 206B. FIG. 2B further illustrates a second plurality of holes 228B (shown schematically as dashed circles 228B) disposed through the second conductive layer 206C. The first and second pluralities of holes 228A, 228B are not shown in FIG. 2A for clarity but are clearly shown in the hereinbelow description of an exemplary fabrication process for the diaphragm 206. In an embodiment, at least one of the first plurality of holes 228A is geometrically aligned with at least one of the second plurality of holes 228B (see, for example, top and bottom sets of holes 528A, 528B in FIG. 5K). In an embodiment, the first and second pluralities of holes are utilized in the final release step in the fabrication process for the diaphragm 206 and the MEMS acoustic transducer 200. Additional structure of and a the fabrication process for the diaphragm 206 used in the MEMS acoustic transducer 200 are further described hereinbelow.

During operation of the MEMS acoustic transducer 100, 200, 600, 700, electric charge is applied to the conductive layer of the at least one backplate 102, 103 and to a conductive layer of the diaphragm 106, 206 thereby inducing an electric field between the at least one backplate 102, 103 and the diaphragm 106, 206 and creating an electrostatic bias on the diaphragm 106, 206. Movement of the air (e.g., resulting from sound waves) pushes against the surface of the diaphragm 106, 206 facing the opening 116 causing the diaphragm 106, 206 to deflect (enter a deflection state) and to deform. This deformation causes a change in the capacitance between the at least one backplate 102, 103 and the diaphragm 106, 206 which can be detected and interpreted as sound.

Figure 3:
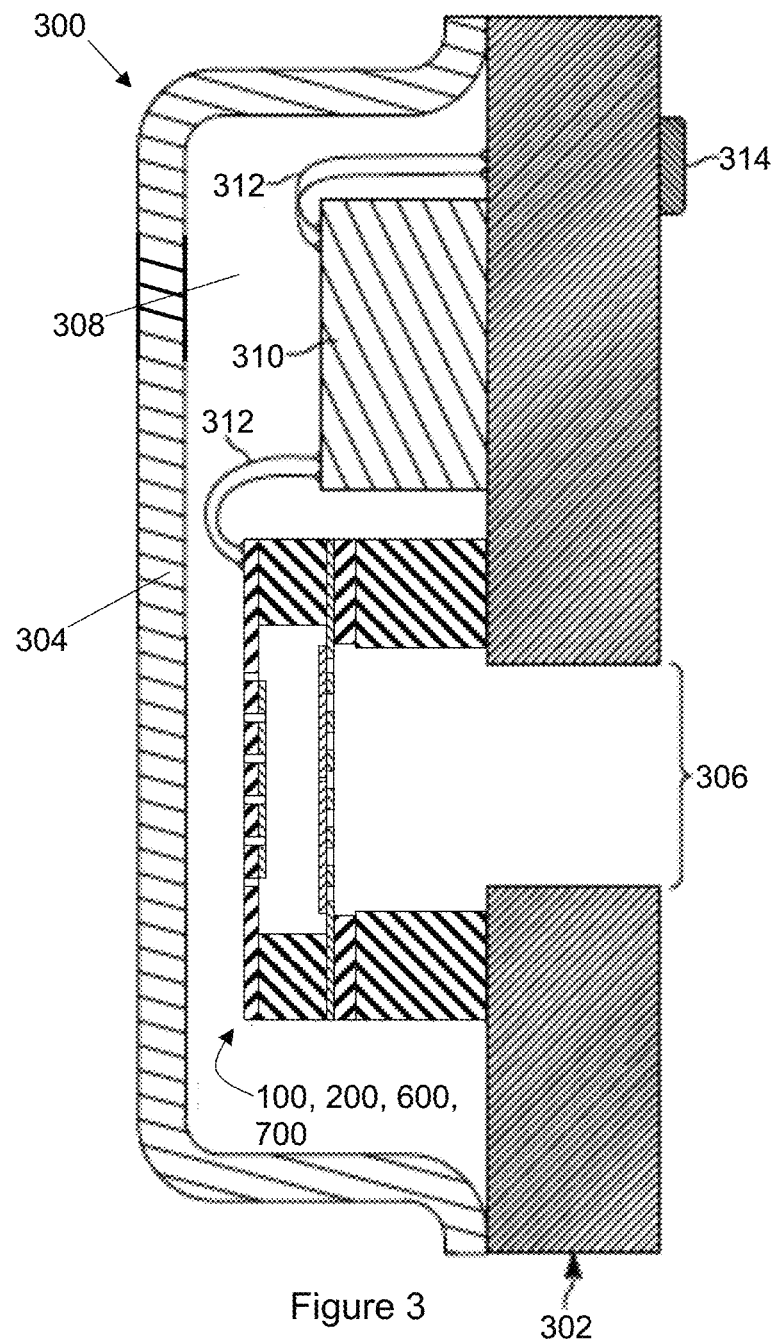
FIG. 3 is a cross-sectional view of a microphone assembly according to an embodiment.

Turning to FIG. 3, the MEMS acoustic transducer 100, 200, 600, 700 is configured to fit within a microphone assembly, generally labeled 300. The assembly 300 includes a housing including a base 302, a cover 304 (e.g., a housing lid), and an acoustic port 306. In one implementation, the base 302 is a printed circuit board. The cover 304 is coupled to the base 302 (e.g., the cover 304 may be mounted onto a peripheral edge of the base 302). Together, the cover 304 and the base 302 form an enclosed volume 308 for the assembly 300. As shown in FIG. 3, the acoustic port 306 is disposed on the base 302 and is structured to convey sound waves to the MEMS acoustic transducer 100, 200, 600, 700 located within the enclosed volume 308. In other implementations, the acoustic port 306 is disposed on the cover 304 and/or a side wall of the cover 304. In some embodiments, the assembly 300 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 300 includes an electrical circuit disposed within the enclosed volume 308. The electrical circuit includes an integrated circuit (IC) 310. The IC 310 may be an application specific integrated circuit (ASIC). Alternatively, the IC 310 may include a semiconductor die integrating various analog, analog-to-digital, and/or digital circuits.

In the assembly 300 of FIG. 3, the MEMS acoustic transducer 100, 200, 600, 700 converts sound waves, received through acoustic port 306, into a corresponding electrical microphone signal. FIG. 3 illustrates a schematic representation of the structure of the MEMS acoustic transducer 100 as illustrated in FIG. 1A; however it is purposely indicated by the numerical labeling 100, 200, 600, 700 that FIG. 3 could also illustrate a schematic representation of the structure of the MEMS acoustic transducer 200, 600, or 700 as illustrated in FIGS. 2A, 2C, or 2D, respectively.

The transducer 100, 200, 600, or 700 generates an electrical signal (e.g., a voltage) at a transducer output in response to acoustic activity incident on the port 306. As shown in FIG. 3, the transducer output includes a pad or terminal of the transducer that is electrically connected to the electrical circuit via one or more bonding wires 312. The assembly 300 of FIG. 3 further includes electrical contacts, shown schematically as contacts 314, typically disposed on a bottom surface of the base 302. The contacts 314 are electrically coupled to the electrical circuit. The contacts 314 are configured to electrically connect the assembly 300 to one of a variety of host devices.

FIGS. 4A-4H depict a portion of the MEMS acoustic transducer 100 in sequential states of fabrication. The work piece being fabricated is illustrated in cross-section with a "top" side for description purposes disposed on the left side thereof. It should be noted that the reference numerals used in the description of the fabrication process illustrated in FIGS. 4A-4H are 400 series numbers corresponding to the 100 series numbers used for analogous structures in FIGS. 1A and 1B. So, for example, as a result of the fabrication process the cylindrical wafer 410 in FIGS. 4A-4H eventually becomes the substrate 110 shown in FIG. 1A. In addition all of the deposition steps for adding layers of material as described hereinbelow can be, for example without limitation, via a vapor deposition process such as a low pressure chemical vapor deposition process or the like as is known in the art.

Figure 4A:
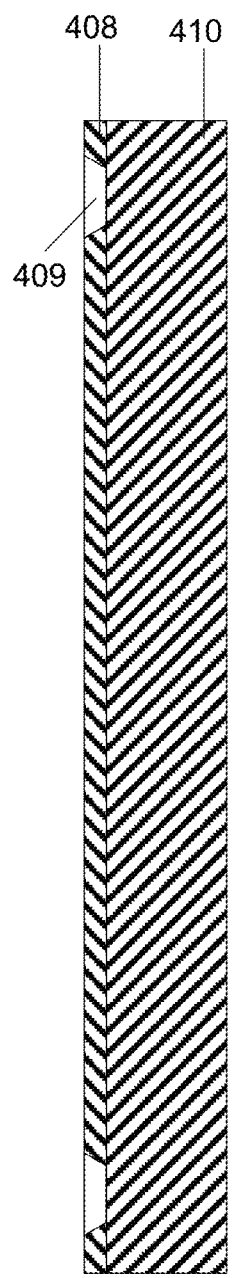
FIG. 4A depicts a stage in the fabrication process for a portion of the MEMS acoustic transducer of FIG. 1A.

Starting with FIG. 4A, a layer 408 of Tetraethyl Orthosilicate (TEOS) Oxide is deposited onto a portion of a top side of a cylindrical wafer 410 of substrate material (shown in cross-section) comprising, for example without limitation, Silicon. In an embodiment, the TEOS Oxide layer 408 is deposited across all but an annular ring 409 of the top surface of the wafer 410. In an embodiment, the thickness of the deposited layer 408 of TEOS Oxide is in a range of about 0.5 µm to about 1.5 µm. The wafer 410 in an embodiment has a thickness in a range of about 500 µm to about 725 µm. Following deposition of the TEOS Oxide layer 408, the work piece is annealed at a temperature of about 1075° C. for about an hour. In other embodiments, the thickness of deposited TEOS Oxide layer 408, the thickness of the wafer 410, and the annealing temperature and time can be different.

Figure 4B:
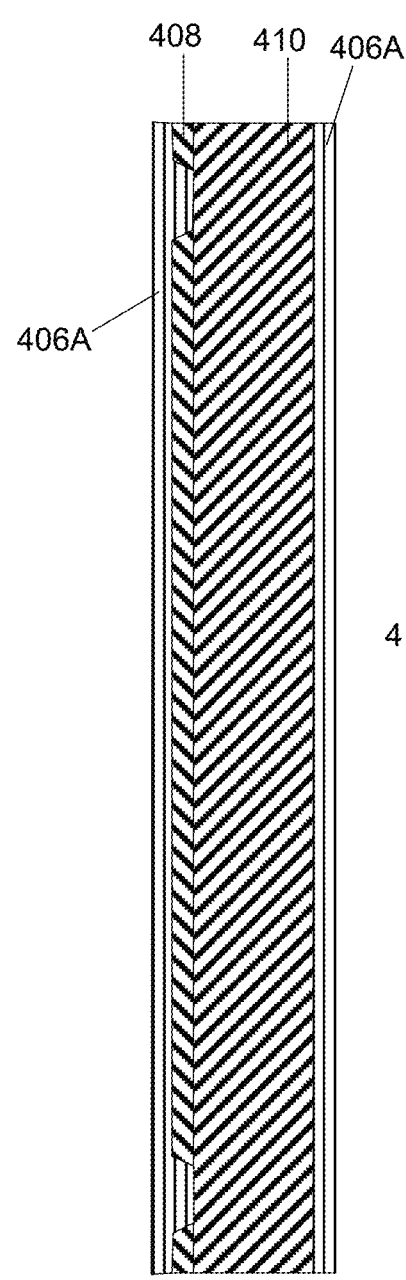
FIG. 4B depicts a stage in the fabrication process for a portion of the MEMS acoustic transducer of FIG. 1A subsequent to the stage shown in FIG. 4A.

FIG. 4B illustrates a second stage in the fabrication process wherein a layer 406A of Silicon Nitride is applied over both top and bottom sides of the wafer 410 as shown, entirely covering the TEOS Oxide layer 408. The layers of 406A Silicon Nitride in an embodiment have a thickness in a range of about 0.5 µm to about 2.5 µm.

Figure 4C:
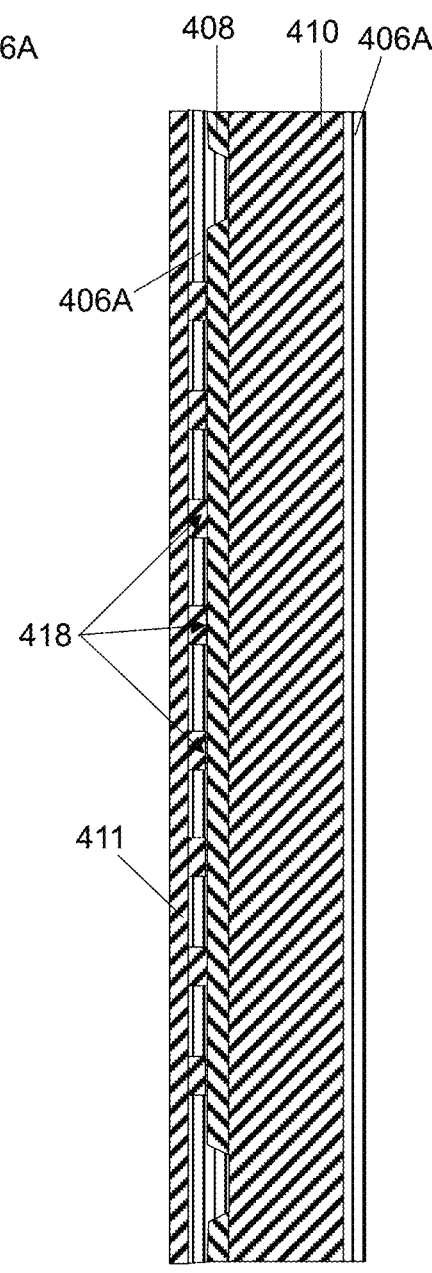
FIG. 4C depicts a stage in the fabrication process for a portion of the MEMS acoustic transducer of FIG. 1A subsequent to the stage shown in FIG. 4B.

FIG. 4C illustrates a further stage in the fabrication process wherein a pattern of slots 418 is cut into the layer 406A of Silicon Nitride on the top side of the work piece, for example, by cutting, piercing, grinding, etching, or other chemical process as is known in the art. Subsequently, a sacrificial layer 411 of polysilicate glass (PSG) is deposited over the slots 418 and the layer 406A of Silicon Nitride, thereby also filling the slots 418. The PSG layer 411 in an embodiment has a thickness of about 2.3 µm.

Figures 4D, 4E, 4F:
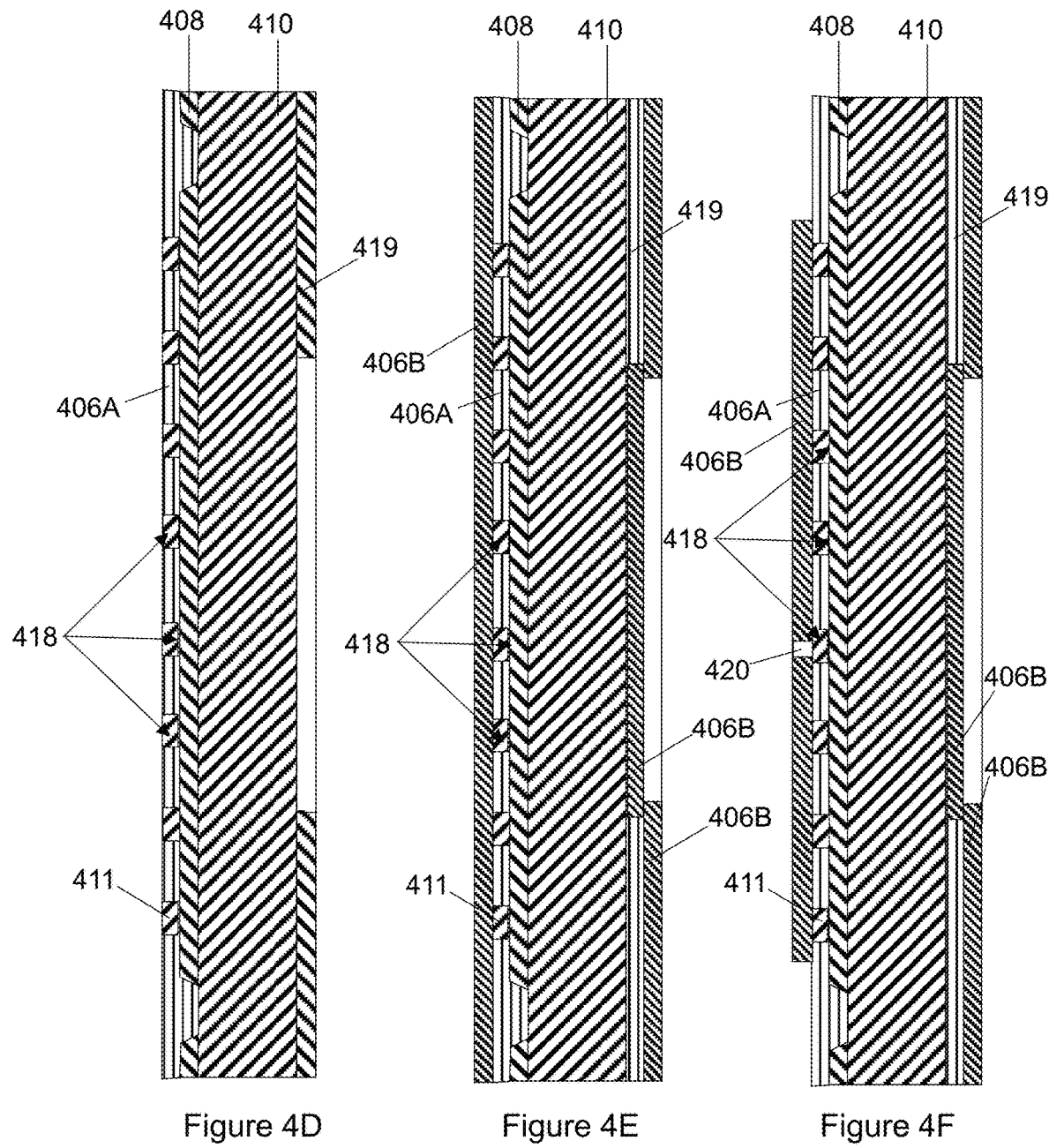
FIG. 4D depicts a stage in the fabrication process for a portion of the MEMS acoustic transducer of FIG. 1A subsequent to the stage shown in FIG. 4C.
FIG. 4E depicts a stage in the fabrication process for a portion of the MEMS acoustic transducer of FIG. 1A subsequent to the stage shown in FIG. 4D.
FIG. 4F depicts a stage in the fabrication process for a portion of the MEMS acoustic transducer of FIG. 1A subsequent to the stage shown in FIG. 4E.

FIG. 4D illustrates yet another stage in the fabrication process wherein the layer 406A of Silicon Nitride on a bottom side of the wafer 410 is removed, for example, by grinding, etching, or polishing. At this stage a layer of PSG is applied to the bottom side of the wafer 410 and subsequently ground, etched, or polished to leave behind the annular PSG layer 419 as shown. Also at this stage, a top side of the work piece is polished to remove the continuous layer of PSG 411 and leave behind a layer 406A of Silicon Nitride about 1.1 µm thick. In FIG. 4E the work piece has had a layer 406B of polycrystalline Silicon applied over the top and bottom sides as shown. In an embodiment, each layer 406B of polycrystalline Silicon has a thickness in a range of about 150 nm to about 300 nm.

Referring to FIG. 4F, a peripheral portion of the layer 406B of polycrystalline Silicon is removed, for example, by grinding, etching, or polishing and the remaining layer 406B of polycrystalline Silicon is pierced with a hole 420, which is also shown in FIG. 1A but not labeled. The hole 420 is not necessarily at the geometric center of the layer 406B of polycrystalline Silicon, and may be slightly offset therefrom as illustrated. The hole 420 is sized and located on the layer 406B of polycrystalline Silicon for the purpose of controlling the low frequency roll off performance of the MEMS acoustic transducer 100.

In FIG. 4G, the bottom side layer 406B of polycrystalline Silicon and a central portion of the wafer 410 have been removed for example, by grinding, etching, or polishing. Finally, in FIG. 4H, the TEOS Oxide layer 408, and the layers 411 and 419 of PSG are removed or released, by grinding, etching, polishing, or another chemical process as is known in the art. The remaining structure illustrated in FIG. 4H is schematically representative of the structure of the MEMS acoustic transducer 100 illustrated in FIG. 1A without the backplate 102 and the first spacer 104.

FIGS. 5A-5K depict a portion of the MEMS acoustic transducer 200 in sequential states of fabrication. The work piece being fabricated is illustrated in cross-section with a "top" side for description purposes disposed on the left side thereof. It should be noted that the reference numerals used in the description of the fabrication method illustrated in FIGS. 5A-5K are 500 series numbers corresponding to the 100 and 200 series numbers used for analogous structures in FIGS. 2A and 2B. So, for example, as a result of the fabrication method the cylindrical wafer 510 in FIGS. 5A-5K eventually becomes the substrate 110 shown in FIG. 2A.

Figure 5A:
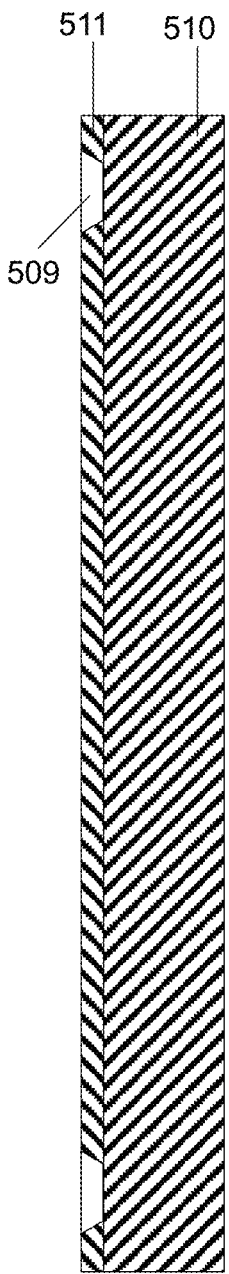
FIG. 5A depicts a stage in the fabrication process for a portion of the MEMS acoustic transducer of FIG. 2A.

Starting with FIG. 5A, a layer 511 of PSG is deposited onto a portion of a top side of a cylindrical wafer 510 of substrate material (shown in cross-section) comprising, for example without limitation, Silicon. In an embodiment, the layer 511 of PSG is deposited across all but an annular ring 509 of the top surface of the wafer 510.

Figure 5B:
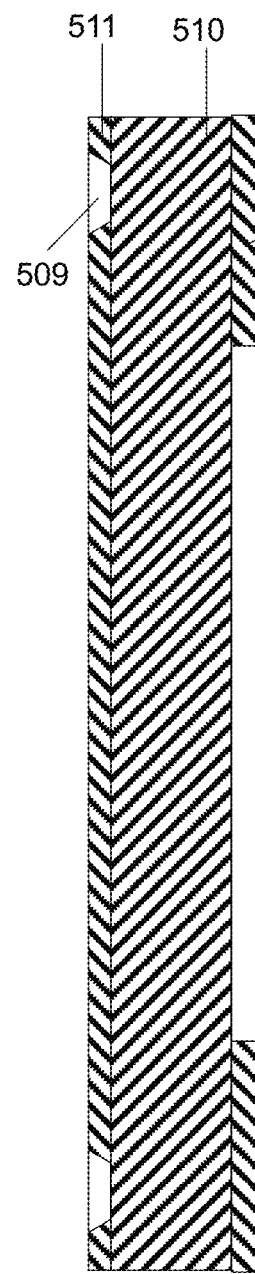
FIG. 5B depicts a stage in the fabrication process for a portion of the MEMS acoustic transducer of FIG. 2A subsequent to the stage shown in FIG. 5A.

FIG. 5B illustrates a layer of PSG having been applied to the bottom side of the wafer 510 and subsequently ground, etched, or polished to leave behind the annular PSG layer 519 as shown. In an embodiment, the thickness of each of the deposited layers 511 and 519 of PSG is in a range of about 0.3 µm to about 1.5 µm. The wafer 510 in an embodiment has a thickness in a range of about 500 µm to about 725 µm. Following deposition of the layers 511 and 519 of PSG, the work piece is annealed at a temperature of about 1075° C. for about an hour. In other embodiments, the thicknesses of deposited layers 511 and 519 of PSG, the thickness of the wafer 510, and the annealing temperature and time can be different.

Figure 5C:
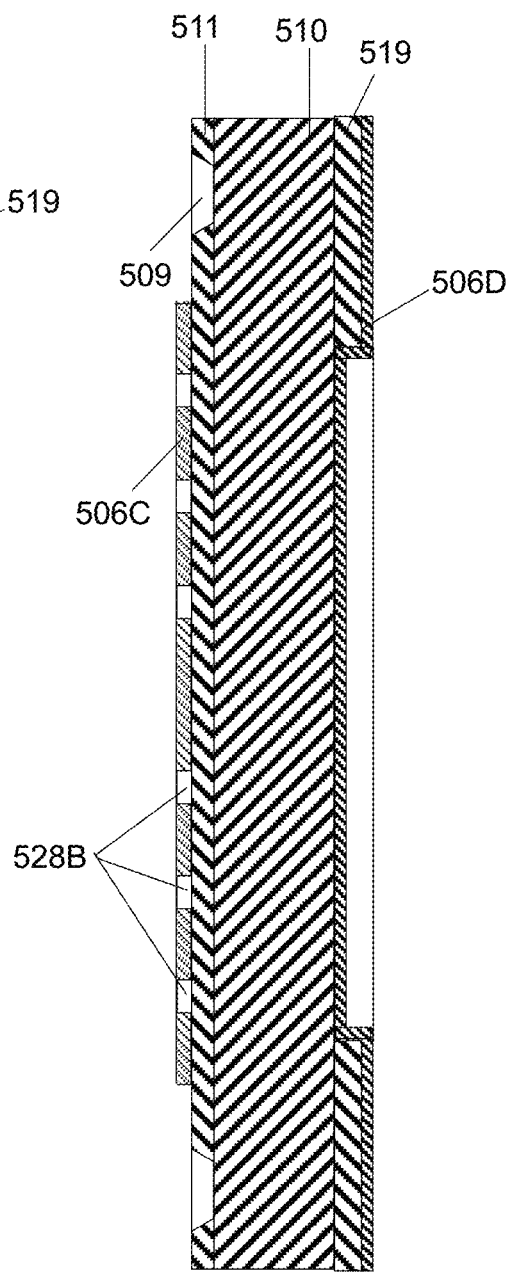
FIG. 5C depicts a stage in the fabrication process for a portion of the MEMS acoustic transducer of FIG. 2A subsequent to the stage shown in FIG. 5B.

Referring now to FIG. 5C, a first layer 506C of polycrystalline Silicon is deposited over a central portion of the layer 511 of PSG. In an embodiment, the first layer 506C of polycrystalline Silicon has a thickness in a range of about 150 nm to about 300 nm. A first plurality of holes 528B is disposed through the first layer 506C of polycrystalline Silicon, for example, by piercing, etching, grinding or otherwise as is known in the art. A layer 506D of polycrystalline Silicon is also deposited on a bottom side of the work piece.

Figures 5D, 5E, 5F:
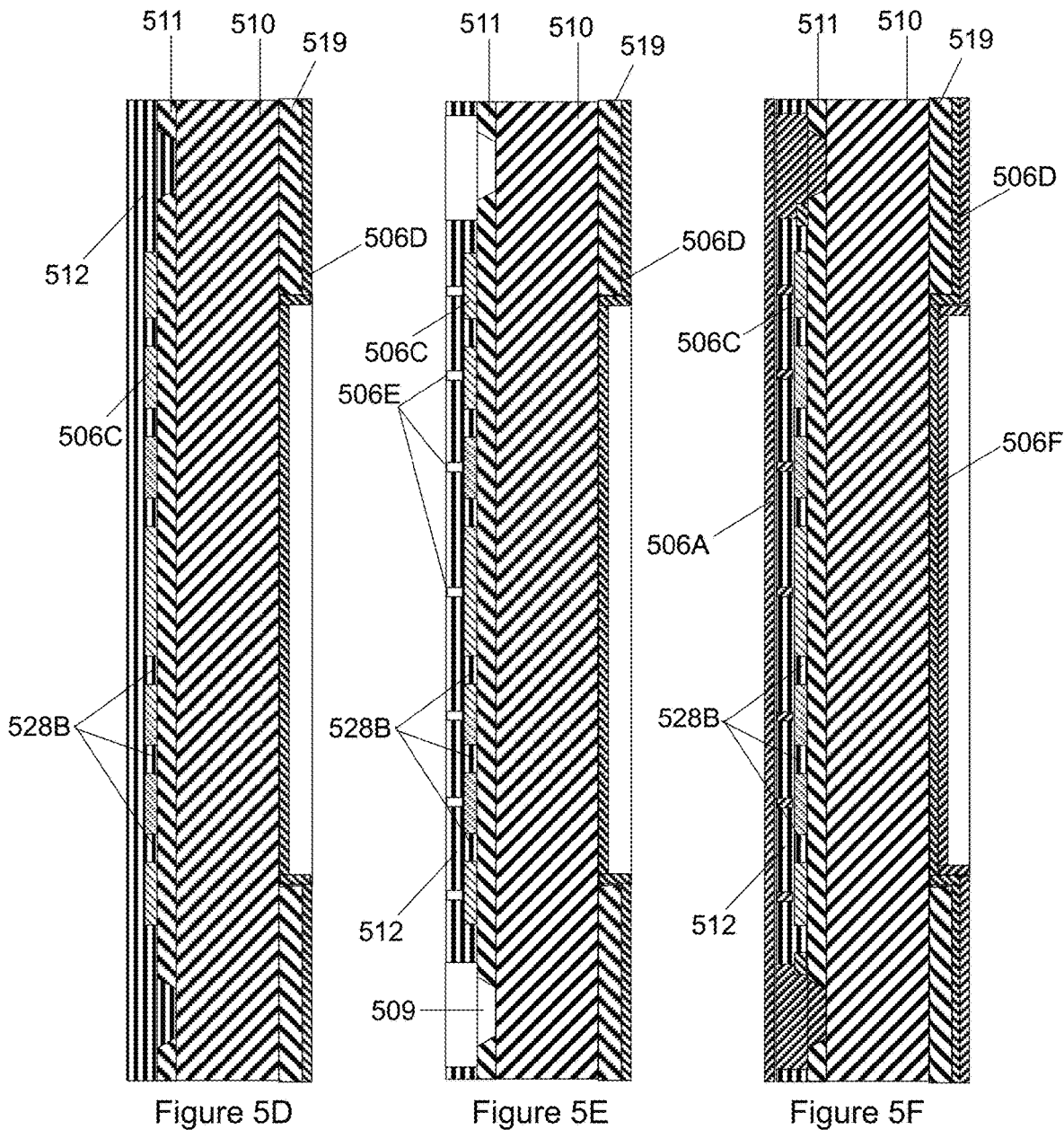
FIG. 5D depicts a stage in the fabrication process for a portion of the MEMS acoustic transducer of FIG. 2A subsequent to the stage shown in FIG. 5C.
FIG. 5E depicts a stage in the fabrication process for a portion of the MEMS acoustic transducer of FIG. 2A subsequent to the stage shown in FIG. 5D.
FIG. 5F depicts a stage in the fabrication process for a portion of the MEMS acoustic transducer of FIG. 2A subsequent to the stage shown in FIG. 5E.

FIG. 5D illustrates a further stage in the fabrication process wherein a sacrificial layer 512 of PSG is applied over a top side of the work piece, thereby filling the first plurality of holes 528B. Following deposition of the sacrificial layer 512 of PSG, the work piece is annealed at a temperature of about 1050° C. for a time in a range of about 1 hour to about 3 hours.

In FIG. 5E, holes, spaces, or openings 506E are created, for example by cutting, piercing, grinding, etching, or other chemical process through the sacrificial layer 512 of PSG, once again exposing the annular ring 509. In FIG. 5F, the holes 506E and the annular ring 509 are filled by a layer 506A of Silicon Nitride applied over the top side of the work piece. In an embodiment, the maximum thickness of the layer 506A of Silicon Nitride measured at the annular ring 509 is about 2.42 µm. A layer 506F of Silicon Nitride is also deposited on a bottom side of the work piece.

Referring to FIG. 5G, the continuous portion of the layer 506A of Silicon Nitride on the top side of the work piece and the layer 506F on the bottom side of the workpiece are removed, for example, by grinding, etching, or polishing. In FIG. 5H, a second layer 506B of polycrystalline Silicon is deposited over a central portion of the top of the workpiece at least spanning the annular ring 509 (now filled with Silicon Nitride). In an embodiment, the second layer 506B of polycrystalline Silicon has a thickness in a range of about 150 nm to about 300 nm. A second plurality of holes 528A is disposed through the second layer 506B of polycrystalline Silicon, for example, by piercing, etching, grinding or otherwise as is known in the art. In an embodiment, at least one of the second plurality of holes 528A is geometrically aligned with at least one of the first plurality of holes 528B. Referring now to FIG. 5I, a layer 525 of PSG is deposited over the top side of the work piece and the work piece is annealed at a temperature of about 1050° C. for a time in a range of about 1 hour to about 3 hours.

Figure 5J:
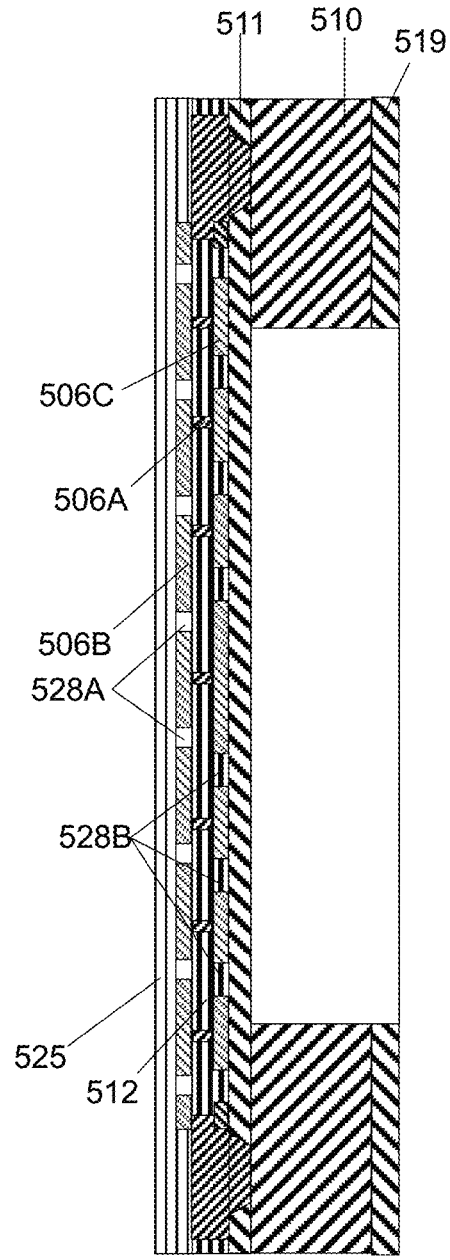
FIG. 5J depicts a stage in the fabrication process for a portion of the MEMS acoustic transducer of FIG. 2A subsequent to the stage shown in FIG. 5I.
Figure 5K:
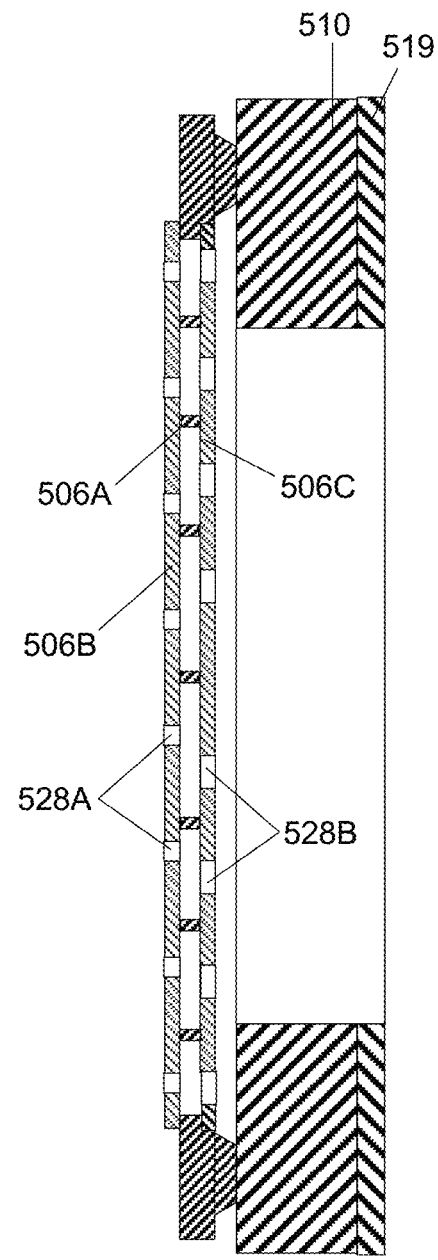
FIG. 5K depicts a stage in the fabrication process for a portion of the MEMS acoustic transducer of FIG. 2A subsequent to the stage shown in FIG. 5J.

In FIG. 5J, the layer 506D of polycrystalline Silicon on the bottom side of the work piece and a central portion of the wafer 510 have been removed for example, by grinding, etching, or polishing. Finally, in FIG. 5K, the layers 511, 512, and 525 of PSG, are removed or released, by grinding, etching, polishing, or another chemical process as is known in the art. The remaining structure illustrated in FIG. 5K is schematically representative of the structure of the MEMS acoustic transducer 200 illustrated in FIGS. 2A and 2B without the backplate 102 and the first spacer 104, and where the first and second pluralities of holes 228A and 228B are not shown in FIG. 2A for clarity.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) acoustic transducer, comprising:
   a substrate having an opening formed therein;
   a diaphragm comprising a slotted insulative layer, and a first conductive layer, the slotted insulative layer attached around a periphery thereof to the substrate and over the opening, the first conductive layer disposed on a first surface of the slotted insulative layer; and
   a backplate separated from the diaphragm and disposed on a side of the diaphragm opposite the substrate.

2. The MEMS acoustic transducer of claim 1, wherein the substrate comprises Silicon, wherein the slotted insulative layer comprises a layer of Silicon Nitride having a thickness in a range of about 0.5 µm to about 1.5 µm, and wherein the first conductive layer comprises a layer of Polycrystalline Silicon having a thickness in a range of about 150 nm to about 300 nm.

3. The MEMS acoustic transducer of claim 2, further comprising a second conductive layer of Polycrystalline Silicon having a thickness in a range of about 150 nm to about 300 nm and disposed on a second surface of the slotted insulative layer, wherein each of the first and second conductive layers of Polycrystalline Silicon includes a plurality of holes disposed therethrough.

4. The MEMS acoustic transducer of claim 3, wherein at least one of the plurality of holes disposed through the first conductive layer is geometrically aligned with at least one of the plurality of holes disposed through the second conductive layer.

5. The MEMS acoustic transducer of claim 1, wherein the slotted insulative layer comprises a plurality of slots disposed therethrough, wherein each slot has a long dimension and a short dimension, wherein the slots are selected from the group of slots consisting of curvilinear slots oriented having the long dimension aligned generally circumferentially around a center of the slotted insulative layer, linear slots having the long dimension aligned generally radially relative to the center of the slotted insulative layer, and a combination thereof, and wherein the short dimension is in a range of about 2 µm to about 8 µm.

6. A microphone device, comprising:
a base having a first surface, an opposing second surface, and a port, wherein the port extends between the first surface and the second surface;
an integrated circuit (IC) disposed on the first surface of the base;
the MEMS acoustic transducer of claim 1 disposed on the first surface of the base; and
a cover disposed over the first surface of the base covering the MEMS acoustic transducer and the IC.

7. A microelectromechanical system (MEMS) acoustic transducer, comprising:
a substrate having an opening formed therein;
a diaphragm comprising a slotted insulative layer, and first and second conductive layers, the slotted insulative layer attached around a periphery thereof to the substrate and over the opening;
the first conductive layer disposed on a first surface of the slotted insulative layer and having a plurality of first holes disposed therethrough, and the second conductive layer disposed on a second surface of the slotted insulative layer and having a plurality of second holes disposed therethrough; and
at least one backplate separated from the diaphragm and attached around a periphery thereof to the substrate.

8. The MEMS acoustic transducer of claim 7, wherein the at least one backplate comprises two backplates and the diaphragm is disposed therebetween.

9. The MEMS acoustic transducer of claim 7, wherein the substrate comprises Silicon, the slotted insulative layer comprises a layer of Silicon Nitride having a thickness in a range of about 0.5 µm to about 1.5 µm, the first conductive layer comprises a first layer of Polycrystalline Silicon having a thickness in a range of about 150 nm to about 300 nm, and the second conductive layer comprises a second layer of Polycrystalline Silicon having a thickness in a range of about 150 nm to about 300 nm.

10. The MEMS acoustic transducer of claim 7, wherein at least one of the plurality of first holes is geometrically aligned with at least one of the plurality of second holes.

11. The MEMS acoustic transducer of claim 10, wherein the slotted insulative layer comprises a plurality of slots disposed therethrough, wherein each slot has a long dimension and a short dimension, wherein the slots are selected from the group of slots consisting of curvilinear slots oriented having the long dimension aligned generally circumferentially around a center of the slotted insulative layer, linear slots having the long dimension aligned generally radially relative to the center of the slotted insulative layer, and a combination thereof, and wherein the short dimension is in a range of about 2 µm to about 8 µm.

12. A microphone device, comprising:
a base having a first surface, an opposing second surface, and a port, wherein the port extends between the first surface and the second surface;
an integrated circuit (IC) disposed on the first surface of the base;
the MEMS acoustic transducer of claim 7 disposed on the first surface of the base; and
a cover disposed over the first surface of the base covering the MEMS acoustic transducer and the IC.

13. A microphone device, comprising:
a microelectromechanical system (MEMS) acoustic transducer, comprising:
a substrate having an opening formed therein;
a diaphragm comprising a slotted insulative layer, and a first conductive layer, the slotted insulative layer attached around a periphery thereof to the substrate and over the opening, the first conductive layer disposed on a first surface of the slotted insulative layer; and
at least one backplate separated from the diaphragm and attached around a periphery thereof to the substrate.

14. The microphone device of claim 13, wherein the slotted insulative layer comprises a plurality of slots disposed therethrough, each slot having a long dimension and a short dimension, wherein the slots are selected from the group of slots consisting of curvilinear slots oriented having the long dimension aligned generally circumferentially around a center of the slotted insulative layer, linear slots having the long dimension aligned generally radially relative to the center of the slotted insulative layer, and a combination thereof, and wherein the short dimension is in a range of about 2 µm to about 8 µm.

15. The microphone device of claim 14, further comprising;
a base having a first surface, an opposing second surface, and a port, wherein the port extends between the first surface and the second surface; and
an integrated circuit (IC) disposed on the first surface of the base; wherein
the MEMS acoustic transducer is disposed on the first surface of the base; and
a cover is disposed over the first surface of the base covering the MEMS acoustic transducer and the IC.

16. The microphone device of claim 14, wherein the substrate comprises Silicon, the slotted insulative layer comprises a layer of Silicon Nitride having a thickness in a range of about 0.5 µm to about 1.5 µm, and the first conductive layer comprises a layer of Polycrystalline Silicon having a thickness in a range of about 150 nm to about 300 nm.

17. The microphone device of claim 16, further comprising a second conductive layer of Polycrystalline Silicon having a thickness in a range of about 150 nm to about 300 nm and disposed on a second surface of the slotted insulative layer, wherein each of the first and second conductive layers of Polycrystalline Silicon includes a plurality of holes disposed therethrough.

18. The microphone device of claim 17, further comprising;
a base having a first surface, an opposing second surface, and a port, wherein the port extends between the first surface and the second surface; and
an integrated circuit (IC) disposed on the first surface of the base; wherein the MEMS acoustic transducer is disposed on the first surface of the base; and a cover is disposed over the first surface of the base covering the MEMS acoustic transducer and the IC.

19. The microphone device of claim 17, wherein the at least one backplate comprises two backplates and the diaphragm is disposed therebetween.

20. The microphone device of claim 17, wherein at least one of the plurality of holes disposed through the first conductive layer of Polycrystalline Silicon is geometrically aligned with at least one of the plurality of holes disposed through the second conductive layer of Polycrystalline Silicon.

* * * * *